(12) United States Patent
Lee et al.

(10) Patent No.: US 10,755,645 B2
(45) Date of Patent: Aug. 25, 2020

(54) SCAN DRIVER AND DISPLAY DEVICE HAVING THE SAME

(71) Applicant: Samsung Display Co., Ltd., Yongin-si, Gyeonggi-do (KR)

(72) Inventors: Hyo-Chul Lee, Hwaseong-si (KR); Cholho Kim, Suwon-si (KR); Hongbo Kim, Seoul (KR); Yoonjung Chai, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/351,136

(22) Filed: Mar. 12, 2019

(65) Prior Publication Data
US 2019/0304377 A1    Oct. 3, 2019

(30) Foreign Application Priority Data
Apr. 2, 2018    (KR) .................... 10-2018-0038174

(51) Int. Cl.
*G09G 3/3266*    (2016.01)
(52) U.S. Cl.
CPC ..... *G09G 3/3266* (2013.01); *G09G 2310/061* (2013.01); *G09G 2310/08* (2013.01)

(58) Field of Classification Search
None
See application file for complete search history.

(56) References Cited

FOREIGN PATENT DOCUMENTS

| KR | 10-2007-0074078 A | 7/2007 | |
| KR | 2007-0074078 * | 7/2007 | ............. G02F 1/133 |
| KR | 10-1332088 B1 | 11/2013 | |
| KR | 10-2017-0045441 A | 4/2017 | |
| KR | 10-2017-0105683 A | 9/2017 | |

* cited by examiner

*Primary Examiner* — Christopher J Kohlman
(74) *Attorney, Agent, or Firm* — Lewis Roca Rothgerber Christie LLP

(57) ABSTRACT

A scan driver includes: a blocking circuit configured to receive a scan control signal and to block the scan control signal lower than a predetermined first reference voltage and higher than a predetermined second reference voltage, wherein the second reference voltage is higher than the first reference voltage; and a plurality of stages configured to output scan signals in response to the scan control signal, wherein the blocking circuit includes: a first block circuit configured to block the scan control signal lower than the first reference voltage; and a second block circuit configured to block the scan control signal higher than the second reference voltage.

20 Claims, 11 Drawing Sheets

SCAN DRIVER AND DISPLAY DEVICE HAVING THE SAME

CROSS-REFERENCE TO RELATED APPLICATION

This application claims priority to and the benefit of Korean Patent Application No. 10-2018-0038174, filed on Apr. 2, 2018 in the Korean Intellectual Property Office (KIPO), the entire content of which is incorporated herein in its entirety by reference.

BACKGROUND

1. Field

Aspects of some example embodiments relate generally to a scan driver and a display device having the same.

2. Description of the Related Art

Flat panel display (FPD) devices are widely used as a display device for electronic devices because FPD devices are relatively lightweight and thin compared to cathode-ray tube (CRT) display devices. Examples of FPD devices are liquid crystal display (LCD) devices, field emission display (FED) devices, plasma display panel (PDP) devices, and organic light emitting display (OLED) devices. The OLED devices have been spotlighted as next-generation display devices because OLED devices have various characteristics such as a relatively wide viewing angle, a relatively rapid response speed, a relatively thin thickness, a relatively low power consumption, etc.

A scan driver of the OLED device includes a plurality of stages that outputs scan signals. Each of the stages outputs the scan signal based on a scan control signal such as a start signal, a clock signal, etc., provided from a timing controller. When the scan control signal having an abnormal range is provided to the scan driver, the scan signal outputs in an abnormal timing. Thus, a display defect may be displayed on a display panel.

The above information disclosed in this Background section is only for enhancement of understanding of the background of the invention and therefore it may contain information that does not constitute prior art.

SUMMARY

Aspects of some example embodiments include a scan driver capable of blocking a scan control signal when the scan control signal having an abnormal range is provided.

Aspects of some example embodiments include a display device capable of blocking a scan control signal when the scan control signal having an abnormal range is provided.

According to an aspect of some example embodiments, a scan driver may include a blocking circuit configured to receive a scan control signal and to block the scan control signal lower than a predetermined first reference voltage and higher than a predetermined second reference voltage, wherein the second reference voltage is higher than the first reference voltage and a plurality of stages configured to output scan signals in response to the scan control signal. The block circuit may include a first block circuit configured to block the scan control signal lower than the first reference voltage and a second block circuit configured to block the scan control signal higher than the second reference voltage.

In some example embodiments, the first block circuit and the second block circuit may be coupled in parallel.

In some example embodiments, the first block circuit may include a first resistor coupled between a first driving voltage providing line and a first node, a second resistor coupled between a second driving voltage providing line and a second node, a first transistor coupled between an input line through which the scan control signal is input and an output line through which the scan control signal is output, the first transistor turns on or turns off in response to a voltage of the second node, a second transistor coupled between the first node and the second node, wherein the second transistor turns on or turns off in response to the scan control signal, and a first capacitor coupled to the output line.

In some example embodiments, a resistor value of the second resistor may be more than 100 times greater than a resistor value of the first resistor.

In some example embodiments, a voltage level of a second driving voltage provided through the second driving voltage providing line may be lower than a voltage level of a first driving voltage provided through the first driving voltage providing line.

In some example embodiments, the first transistor may turn off when the scan control signal having a voltage level lower than the first reference voltage is provided and the scan control signal is not output, and the first transistor may turn on when the scan control signal having a voltage level higher than the first reference voltage is provided and the scan control signal is output.

In some example embodiments, the second block circuit may include a third resistor coupled between a first driving voltage providing line and a third node, a fourth resistor coupled between a third driving voltage providing line and a fourth node, a fifth resistor coupled between the first driving voltage providing line and a fifth node, a sixth resistor coupled between a second driving voltage providing line and a sixth node, a third transistor coupled between an input line through which the scan control signal is input and an output line through which the scan control signal is output, the third transistor configured to turn on or turn off in response to a voltage of the sixth node, a fourth transistor coupled between the third node and the fourth node, the fourth transistor configured to turn on or turn off in response to the scan control signal, a fifth transistor coupled between the fifth node and the sixth node, the fifth transistor configured to turn on or turn off in response to a voltage of the fourth node, and a second capacitor coupled to the output line.

In some example embodiments, a resistor value of the third resistor and a resistor value of the fifth resistor may be the same, a resistor value of the fourth resistor and a resistor value of the sixth resistor may be the same, and the resistor values of the fourth resistor and the sixth resistor may be more than 100 times greater than the resistor values of the third resistor and the fifth resistor.

In some example embodiments, a voltage level of a first driving voltage provided through the first driving voltage providing line may be higher than a voltage level of a second driving voltage provided through the second driving voltage providing line and a voltage level of a third driving voltage provided through the third driving voltage providing line.

In some example embodiments, the third transistor may turn off and the scan control signal may not be output when the scan control signal having a voltage level higher than the second reference voltage is provided, and the third transistor may turn on and the scan control signal may be output when the scan control signal having a voltage level lower than the second reference voltage is provided.

In some example embodiments, the scan control signal may include a start signal and at least one clock signal.

In some example embodiments, the block circuit may be respectively coupled to a start signal providing line through which the start signal is provided and a clock signal providing line through which the clock signal is provided.

According to an aspect of some example embodiments, a display device may include a display panel including a plurality of pixels, a plurality of data lines coupled to the pixels, and a plurality of scan lines coupled to the pixels, a timing controller configured to convert a first image data provided from an external device to a second image data and to generate a scan control signal and a data control signal that control a driving timing of the second image data, a scan driver configured to generate a scan signal based on the scan control signal and to provide the scan signal to the pixels through the scan lines, and a data driver configured to generate a data signal corresponding to the second image data based on the data control signal and to provide the data signal to the pixels through the data lines. The scan driver may include a block circuit configured to block the scan control signal having a voltage level lower than a predetermined first reference voltage and lower than the predetermined second reference voltage that is lower than the first reference voltage and a plurality of stages configured to output a scan signal in response to the scan control signal. The block circuit may include a first block circuit configured to block the scan control signal lower than the first reference voltage and a second block circuit configured to block the scan control signal higher than the second reference voltage.

In some example embodiments, the first block circuit and the second block circuit may be coupled in parallel.

In some example embodiments, the first block circuit may include a first resistor coupled between a first driving voltage providing line and a first node, a second resistor coupled between a second driving voltage providing line and a second node, a first transistor coupled between an input line through which the scan control signal is input and an output line through which the scan control signal is output, the first transistor configured to turn on or turn off in response to a voltage of the second node, a second transistor coupled between the first node and the second node, the second transistor configured to turn on or turn off in response to the scan control signal, and a first capacitor coupled to the output line.

In some example embodiments, the first transistor may turn off and the scan control signal may not be output when the scan control signal having a voltage level lower than the first reference voltage is provided, and the first transistor may turn on and the scan control signal may be output when the scan control signal having a voltage level higher than the first reference voltage is provided.

In some example embodiments, the first resistor and the second resistor may be mounted on a printed circuit board (PCB) or a flexible printed circuit board (FPCB).

In some example embodiments, the second block circuit may include a third resistor coupled between a first driving voltage providing line and a third node, a fourth resistor coupled between a third driving voltage providing line and a fourth node, a fifth resistor coupled between the first driving voltage providing line and a fifth node, a sixth resistor coupled between a second driving voltage providing line and a sixth node, a third transistor coupled between an input line through which the scan control signal is input and an output line through which the scan control signal is output, the third transistor configured to turn on or turn off in response to a voltage of the sixth node, a fourth transistor coupled between the third node and the fourth node, the fourth transistor configured to turn on or turn off in response to the scan control signal, a fifth transistor coupled between the fifth node and the sixth node, the fifth transistor configured to turn on or turn off in response to a voltage of the fourth node, and a second capacitor coupled to the output line.

In some example embodiments, the third transistor may turn off and the scan control signal may not be output when the scan control signal having a voltage level higher than the second reference voltage is provided, and the third transistor may turn on the scan control signal may be output when the scan control signal having a voltage level lower than the second reference voltage is provided.

In some example embodiments, the third resistor, the fourth resistor, the fifth resistor, and the sixth resistor may be mounted on a printed circuit board (PCB) or a flexible printed circuit board (FPCB).

Therefore, the scan driver and the display device according to some example embodiments may prevent or reduce instances of the abnormal scan signal by including the block circuit that receives the scan control signal and block the scan control signal when the scan control signal has the voltage level lower than the first reference voltage and higher than the second reference voltage. Thus, a display defect of the display device may improve.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Hereinafter, aspects of some example embodiments of the present invention will be explained in more detail with reference to the accompanying drawings.

Figure 1:
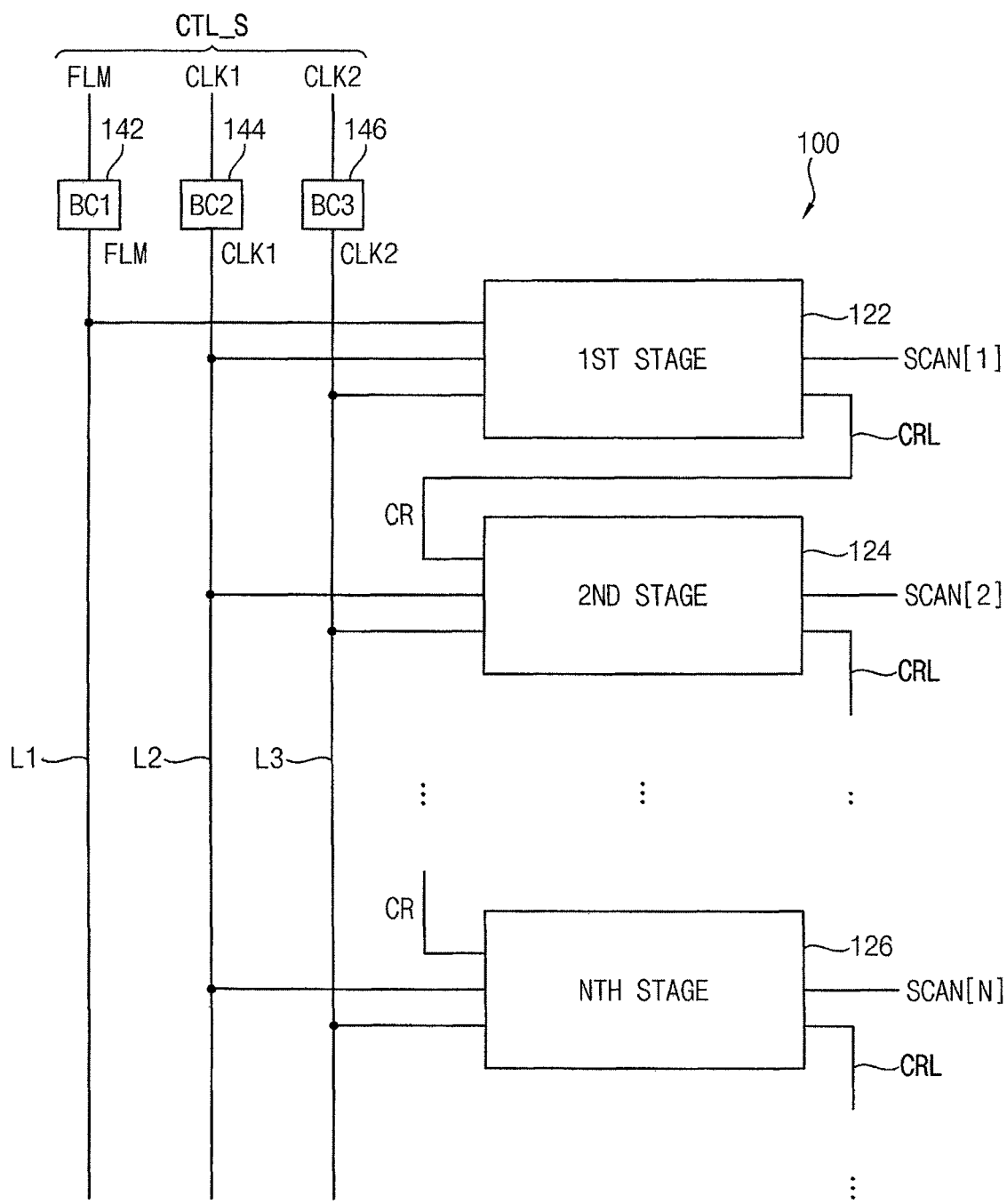
FIG. 1 is a block diagram illustrating a scan driver according to some example embodiments.
Figure 2:
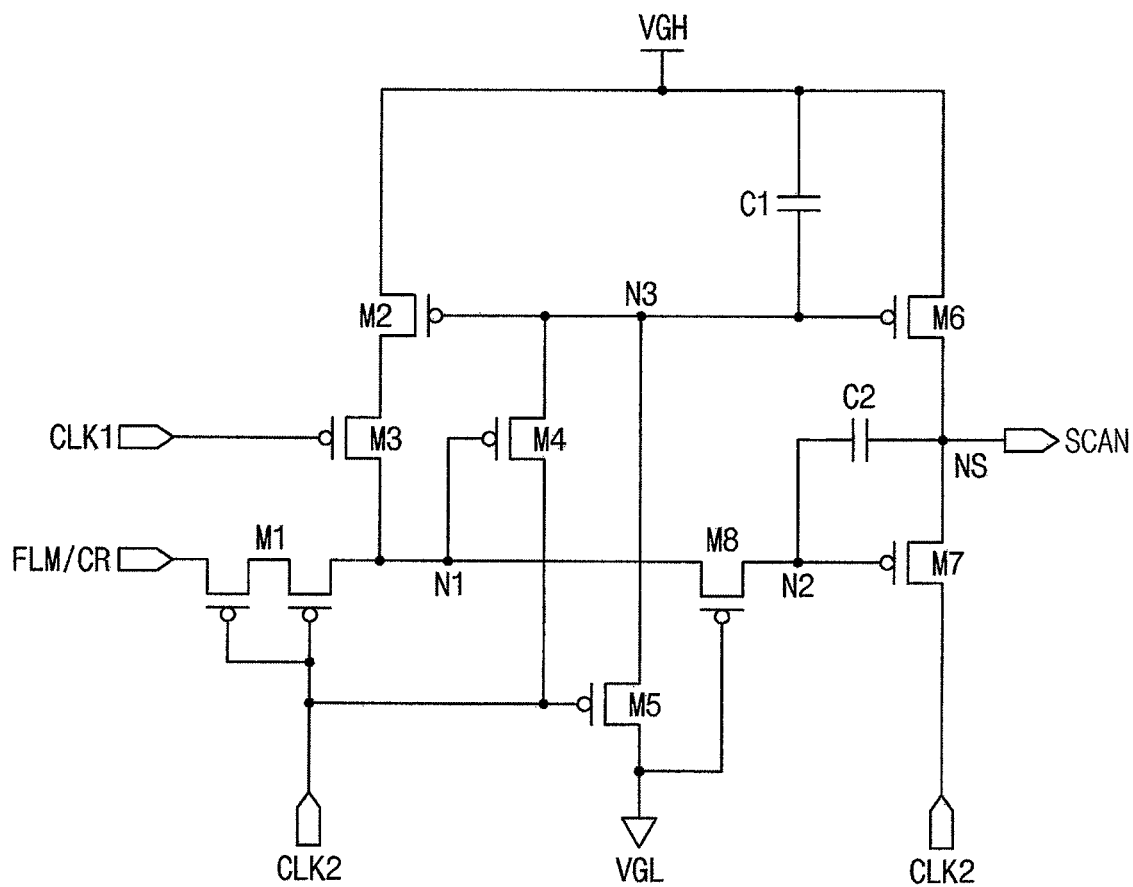
FIG. 2 is a circuit diagram illustrating an example of a stage included in the scan driver of FIG. 1.

FIG. 1 is a block diagram illustrating a scan driver according to some example embodiments and FIG. 2 is a circuit diagram illustrating an example of a stage included in the scan driver of FIG. 1.

Referring to FIG. 1, a scan driver 100 may include a plurality of stages 122, 124, 126 and block circuits 142, 144, 146. Each of the stages 122, 124, 126 may be dependently coupled and sequentially output scan signals SCAN[1], SCAN[2], SCAN[3]. The scan signals SCAN[1], SCAN[2], SCAN[3] may be provided to pixels of a display panel through scan lines formed on the display panel.

Each of the stages 122, 124, 125 may receive a scan control signal CTL_S. The scan control signal CTL_S may include a start signal and at least one clock signal. For example, the stages 122, 124, 126 of FIG. 1 may receive the start signal FLM, a first clock signal CLK1, and a second clock signal CLK2. Each of the stages 122, 24, 126 may be coupled to a second line L2 and a third line L3. Each of the stages 122, 24, 126 may receive the first clock signal through the second line L2, and the second clock signal CLK2 through the third line L3. The first stage 122 may be coupled to a first line L1. The first stage 122 may receive the start signal FLM through the first line L1. The remaining stages except the first stage 122 may receive a carry signal CR output from a previous stage. For example, the carry signal may be the same signal as the scan signal SCAN[1], SCAN[2], SCAN[3] output from the previous stage. Each of the stages 122, 124, 125 may receive a first driving voltage VGH through a first driving voltage providing line and a third driving voltage VGL through a third driving voltage providing line. Here, the first driving voltage VGH may have a high level (e.g., 7V) higher than 0V, and the third voltage VGL may have a low level (e.g., -9V) lower than 0V.

The first stage 122 may generate the scan signal SCAN[1] based on the start signal FLM, the first clock signal CLK1, and the second clock signal CLK2. The scan signal SCAN[1] generated in the first stage 122 may be provided to the pixels coupled to a first scan line. For example, the first scan line may be coupled to the pixels formed in a first column of the display panel. Here, the scan signal SCAN[1] may be provided to the second stage 124 as the carry signal CR.

The second stage 124 may generate the scan signal SCAN[2] based on the carry signal CR, the first clock signal CLK1, and the second clock signal CLK2. The scan signal SCAN[2] generated in the second stage 124 may be provided to the pixels coupled to a second scan line. For example, the second scan line may be coupled to the pixels formed in a second column of the display panel. Here, the scan signal SCAN[2] may be provided to the third stage 126 as the carry signal CR.

The Nth stage 126 may generate the scan signal SCAN[N] based on the carry signal CR, the first clock signal CLK1, and the second clock signal CLK2, where the N is an integer equal to or greater than 2). The scan signal SCAN[N] generated in the Nth stage may be provided to the pixels coupled to an Nth scan line. For example, the Nth scan line may be coupled to the pixels formed in an Nth column of the display panel. Here, the scan signal SCAN[N] may be provided to a (N+1)th stage as the carry signal CR.

As described above, the stages 122, 124, 126 may be dependently coupled and sequentially output the scan signals SCAN[1], SCAN[2], SCAN[3]. That is, the first stage 122 may generate the scan signal SCAN[1] based on the start signal FLM, the first clock signal CLK1, and the second clock signal CLK2 and the Nth stage may generate the scan signal SCAN[N] based on the carry signal CR, the first clock signal CLK1, and the second clock signal CLK2.

For example, the stages 122, 124, 126 may respectively include a circuit of FIG. 2. Referring to FIG. 2, at least one of the stages 122, 124, 126 may include a first switching transistor M1, a second switching transistor M2, a third switching transistor M3, a fourth switching transistor M4, a fifth switching transistor M5, a sixth switching transistor M6, a seventh switching transistor M7, a eighth switching transistor M8, a first capacitor C1, a second capacitor C2.

The first switching transistor M1 may turn on or turn off in response to eh second clock signal CLK2. The first switching transistor M1 may be coupled between the first line L1 or a carry signal providing line CRL and a first node N1. When the stage is the first stage 122 coupled to the first scan line formed on the display panel, the first switching transistor M1 included in the first stage 122 may be coupled between the first line L1 and the first node N1. When the stage is the Nth stage 126 coupled to the Nth scan line formed on the display panel, the first switching transistor M1 included in the Nth stage 126 may be coupled between the carry signal providing line CRL and the first node N1. The first switching transistor M1 may have a gate electrode coupled to the third line L3, a first electrode coupled to the first line L1 or the carry signal providing line CRL, and a second electrode coupled to the first node N1. When the first switching transistor M1 turns on, the start signal FLM provided through the first line L1 or the carry signal CR provided through the carry signal providing line CRL may be provided to the first node N1.

The second switching transistor M2 may turn on or turn off in response to a voltage of a third node N3. The second switching transistor M2 may be coupled between the first driving voltage providing line and the third switching transistor M3. The second switching transistor M2 may have a gate electrode coupled to the third node N3, a first electrode coupled to the first driving voltage providing line, and a second electrode coupled to the third switching transistor M3. When the second switching transistor M2 turns on, the first driving voltage VGH provided through the first driving voltage providing line may be provided to the third switching transistor M3. The third switching transistor M3 may turn on or turn off in response to the first clock signal CLK1. The third switching transistor M3 may be coupled between the first node N1 and the second switching transistor M2. The third switching transistor M3 may have a gate electrode coupled to the second line L2, a first electrode coupled to the first node N1, and a second electrode coupled to the second switching transistor M2. When the third switching transistor M3 turns on, a voltage of the second electrode of the second switching transistor M2 may be provided to the first node N1.

The fourth switching transistor M4 may turn on or turn off in response to the voltage of the first node N1. The fourth switching transistor M4 may be coupled between the third line L3 and the third node N3. The fourth switching transistor M4 may have a gate electrode coupled to the first node N1, a first electrode coupled to the third node N3, and a second electrode coupled to the third line L3. When the fourth switching transistor M4 turns on, the second clock signal CLK2 may be provided to the third node N3. The fifth switching transistor M5 may turn on or turn off in response to eh second clock signal CLK2. The fifth switching transistor M5 may be coupled between the third driving voltage providing line and the third node N3. The fifth switching transistor M5 may have a gate electrode coupled to the third line L3, a first electrode coupled to the third node N3, and a second electrode coupled to the third driving voltage providing line. When the fifth switching transistor M5 turns on, the third driving voltage VGL provided through the third driving voltage providing line may be provided to the third node N3.

The sixth switching transistor M6 may turn on or turn off in response to a voltage of the third node N3. The sixth switching transistor M6 may be coupled between the first driving voltage providing line and a scan output node NS. The sixth switching transistor M6 may have a gate electrode coupled to the third node N3, a first electrode coupled to the first driving voltage providing line, and a second electrode coupled to the scan output node NS. When the sixth switching transistor M6 turns on, the first voltage VGH provided through the first driving voltage providing line may be provided to the scan output node NS.

Here, the first driving voltage VGH applied to the scan output node NS may be output as the scan signal SCAN. The seventh switching transistor M7 may turn on or turn off in response to a voltage of the second node N2. The seventh switching transistor M7 may be coupled between the scan output node NS and the second line L2. The seventh switching transistor M7 may have a gate electrode coupled to the second node N2, a first electrode coupled to the scan output node NS, and a second electrode coupled to the second line L2. When the seventh switching transistor M7 turns on, the first clock signal CLK1 may be provided to the scan output node NS.

Here, the first clock signal CLK1 applied to the scan output node NS may be output as the scan signal SCAN. The eighth switching transistor M8 may turn on or turn off in response to the third driving voltage VGL. The eighth switching transistor M8 may be coupled between the first node N1 and the second node N2. The eighth switching transistor M8 may have a gate electrode coupled to the third driving voltage providing line, a first electrode coupled to the first node N1, and a second electrode coupled to the second node N2. When the eighth switching transistor M8 turns on, the voltage of the first node N1 may be provided to the second node N2. The first capacitor C1 may be coupled between the first driving voltage providing line and the third node N3. The first capacitor may have a first electrode coupled to the first driving voltage providing line and a second electrode coupled to the third node N3. The first capacitor C1 may store a difference between the first driving voltage VGH and the voltage applied to the third node N3. The second capacitor C2 may be coupled between the second node N2 and the scan output node NS. The second capacitor C2 may include a first electrode coupled to the second node N2 and a second nod e coupled to the scan output node NS. The second capacitor C2 may store a difference between the voltage applied to the second node N2 and the voltage applied to the scan output node NS.

When the scan control signal CTL_S (e.g., the start signal FLM, the first clock signal CLK1, and the second clock signal CLK2) is abnormally provided, the stage 122, 124, 126 may output abnormal scan signal SCAN. For example, when the start signal FLM and clock signals CLK1, CLK2 are provided through a flexible printed circuit board FPCB, the start signal FLM and clock signals CLK1, CLK2 may be abnormally provided because of line defects such as a short, an open, or a coupling, etc. When the second clock signal CLK2 having a voltage level lower than the start signal FLM is provided to the circuit of the stage of FIG. 2, the first switching transistor rM1 and the seventh switching transistor M7 may turn on and the scan signal SCAN may be abnormally output. The pixels may emit light in response to the abnormal scan signal. The scan driver 100 according to example embodiments may include the block circuit 142, 144, 146 that block the scan control signal CTL_S when the scan control signal CTL_S out of a range (e.g., a predetermined range) is provided. Thus, the abnormal scan signal may not be output.

Referring to FIG. 1, the block circuit 142, 144, 146 may be coupled to providing lines that provides the scan control signal CTL_S. The block circuit 142, 144, 146 may receive the scan control signal CTL_S and block the scan control signal when the scan control signal CTL_S has a voltage level lower than a predetermined first reference voltage or higher than a predetermined second reference voltage. As described above, the scan control signal CTL_S may include the start signal FLM and at least one clock signal. The block circuit 142, 144, 146 may be respectively coupled to the first line L1 through which the start signal FLM is provided, the second line L2 through which the first clock signal CLK1 is provided, and the third line L3 through which the second clock signal CLK2 is provided. The block circuit 142, 144, 146 may block the scan control signal CTLS when the scan control signal CTL_S (e.g., the start signal FLM, the first clock signal CLK1, and the second clock signal CLK2) having the voltage level out of the predetermined range is provided, so that the abnormal scan signal SCAN may not be output. Hereinafter, the block circuit 142, 144, 146 will be described in more detail.

As described above, the scan driver 100 of FIG. 1 may include the block circuit 142, 144, 146 that is arranged between the providing lines through which the scan control signal CTL_S is provided, receives the scan control signal CTL_S, and block the scan control signal CTL_S when the scan control signal CTL_S has the voltage level lower than the first reference voltage and higher than the second reference voltage. Thus, the scan driver 100 may prevent or reduce instances of the stages 122, 124, 126 outputting an abnormal scan signal SCAN.

Figure 3:
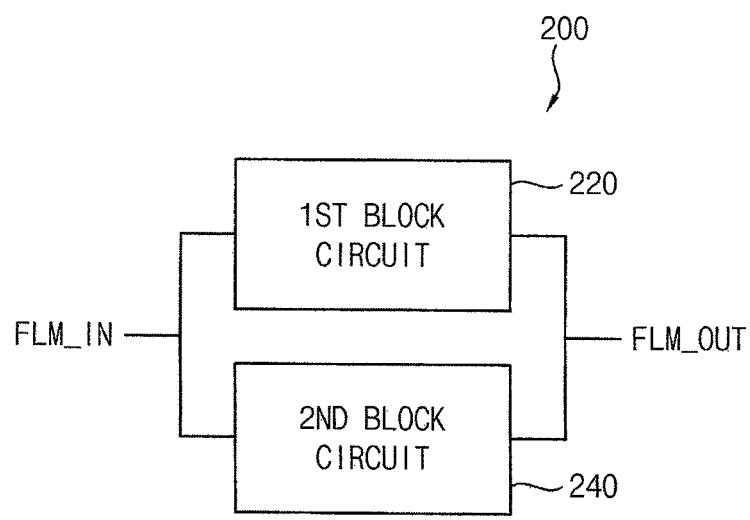
FIG. 3 is a block diagram illustrating a block circuit included in the scan driver of FIG. 1.

FIG. 3 is a block diagram illustrating a block circuit included in the scan driver of FIG. 1 and FIGS. 4A through 4C are graphs illustrating for describing an operation of the block circuit of FIG. 3.

Referring to FIG. 3, a block circuit 200 may include a first block circuit 220 and a second block circuit 240. Here, the block circuit 200 of FIG. 3 may correspond to one of the block circuits 142, 144, 146 of FIG. 1. The first block circuit 220 and the second block circuit 240 may be coupled in parallel. The first block circuit 220 may block the scan control signal lower than the first reference voltage VR1 and the scan control signal higher than the second reference voltage VR2. Here, the scan control signal may be the start signal FLM_IN. Referring to FIG. 3, the first block circuit 220 may block the input start signal FLM_IN having a voltage lower than the first reference voltage VR1 and the second block circuit 240 may block the input start signal FLM_IN having a voltage higher than the second reference voltage VR2. The block circuit 200 may output an output start signal FLM_OUT that is in the range between the first reference voltage VR1 and the second reference voltage VR2 (e.g., in the normal range) by blocking the input start signal FLM_IN having the voltage level lower than the first reference voltage VR1 and higher than the second reference voltage VR2. The block circuit 200 may block the abnormal clock signal by being arranged in the clock signal providing line that provides the clock signal although the block circuit 200 that blocks the abnormal start signal is described in FIG. 3.

Figure 4A:
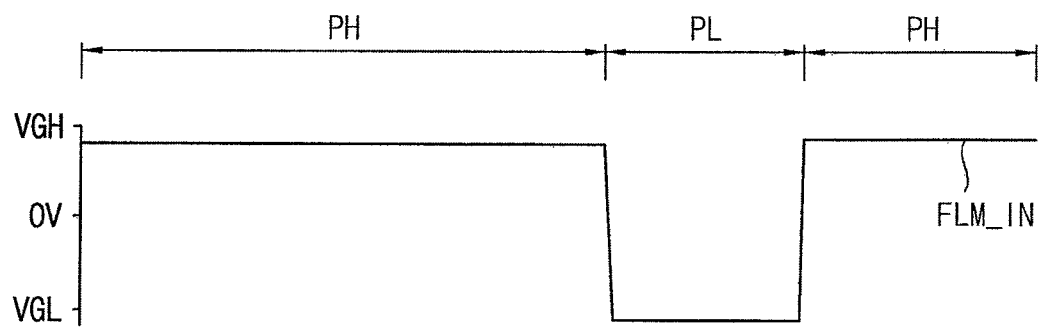
FIGS. 4A through 4C are graphs illustrating for describing an operation of the block circuit of FIG. 3.
Figure 4B:
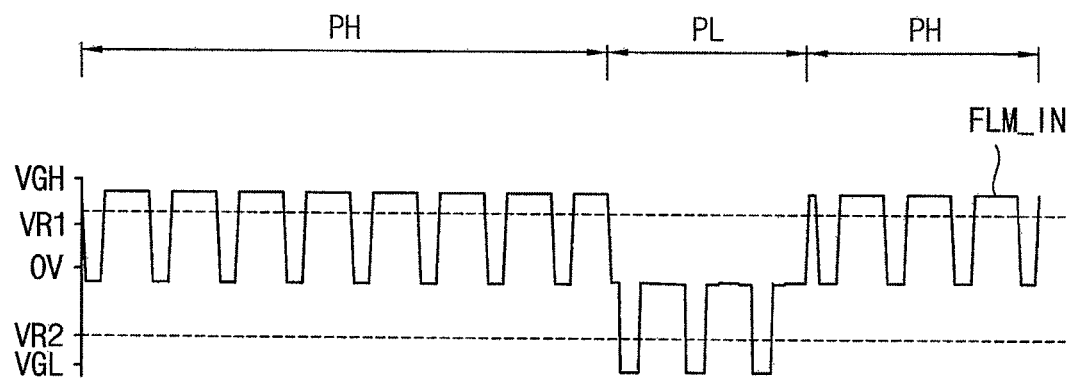

Referring to FIG. 4A, the input start signal may include a high period PH and a low period PL. The input start signal FLM_IN having the first driving voltage VGH is provided during the high period PH and the input start signal FLM_IN having the third driving voltage VGL is provided during the low period PL. The first switching transistor M1 of the stage of FIG. 2 may turn off and the scan signal SCAN may not be output during the high period PH of the input start signal FLM_IN. The first switching transistor M1 of the stage of FIG. 2 may turn on and the scan signal SCAN may be output during the low period PL of the input start signal FLM_IN. When the normal input start signal FLM_IN is provided, the block circuit 200 may output the input start signal FLM_IN as the output start signal FLM_OUT.

Referring to 4B, the abnormal input start signal FLM_IN occurred by the line defects such as the short, the open, the coupling, etc. may be provided to the block circuit 200. For example, the input start signal FLM_IN having the voltage level lower than the first reference voltage VR1 during the high period PH and the input start signal FLM_IN having the voltage level higher than the second reference voltage VR2 during the low period PL as described in FIG. 4B. When the input start signal FLM_IN having the voltage level lower than the first reference voltage VR1 is provided to the first stage 122 of FIG. 1 during the high period PH, the first switching transistor M1 of the first stage 122 may turn on and the scan signal SCAN may be abnormally output. Further, when the input start signal FLM_IN having the voltage level higher than the second reference voltage VR2 is provided to the first stage 122 of FIG. 1 during the low period PL, the first switching transistor M1 of the first stage 122 may turn on and the scan signal SCAN may not be output.

Figure 4C:
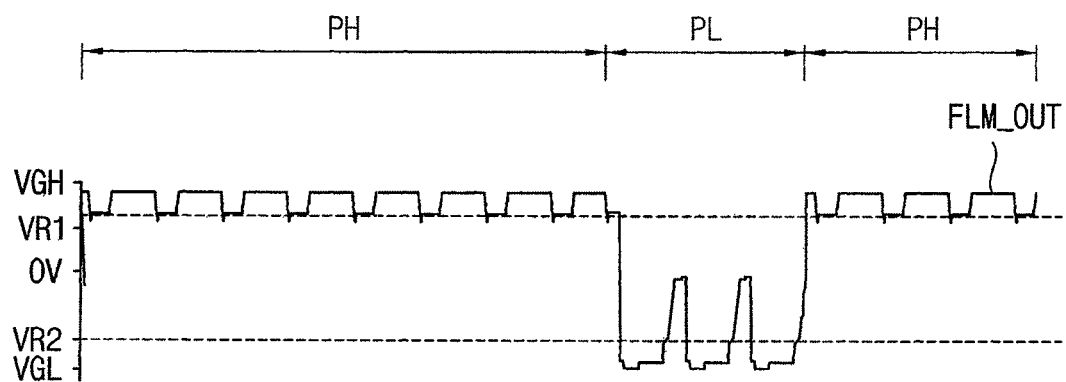

Referring to FIG. 4C, the block circuit 200 may block the input start signal FLM_IN having the voltage level lower than the first reference voltage VR1 during the high period, block the input start signal FLM_IN having the voltage level higher than the second reference voltage VR2, output as the output start signal FLM_OUT. A voltage stored in the first capacitor may be discharged and the voltage level of the input start signal FLM_IN may be maintained while the input start signal FLM_IN having the voltage level lower than the first reference voltage VR1 is blocked. Further, a voltage stored in the second capacitor may be discharged and the voltage level of the input start signal FLM_IN may be maintained while the input start signal FLM_IN having the voltage level higher than the second reference voltage VR2.

Figure 5:
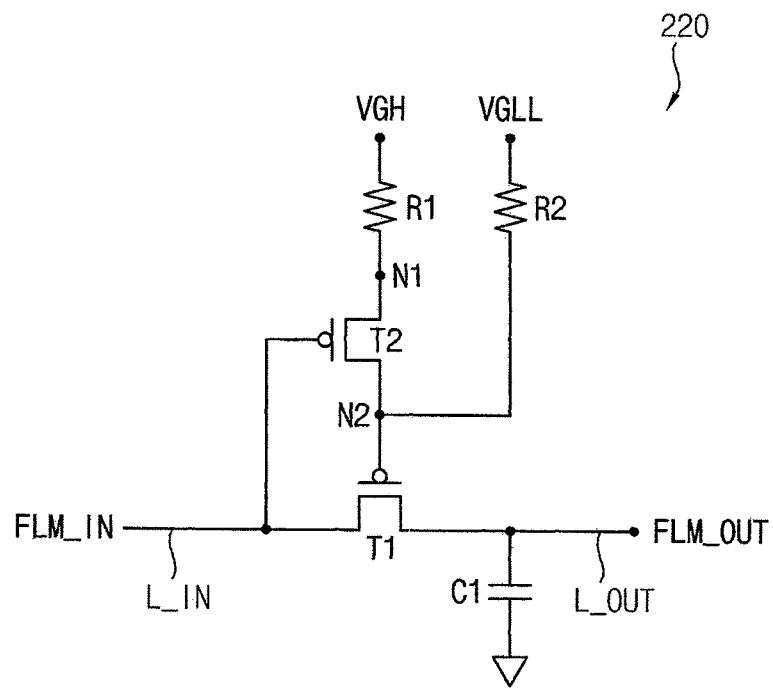
FIG. 5 is a circuit diagram illustrating a first block circuit included in the block circuit of FIG. 3.
Figure 6A:
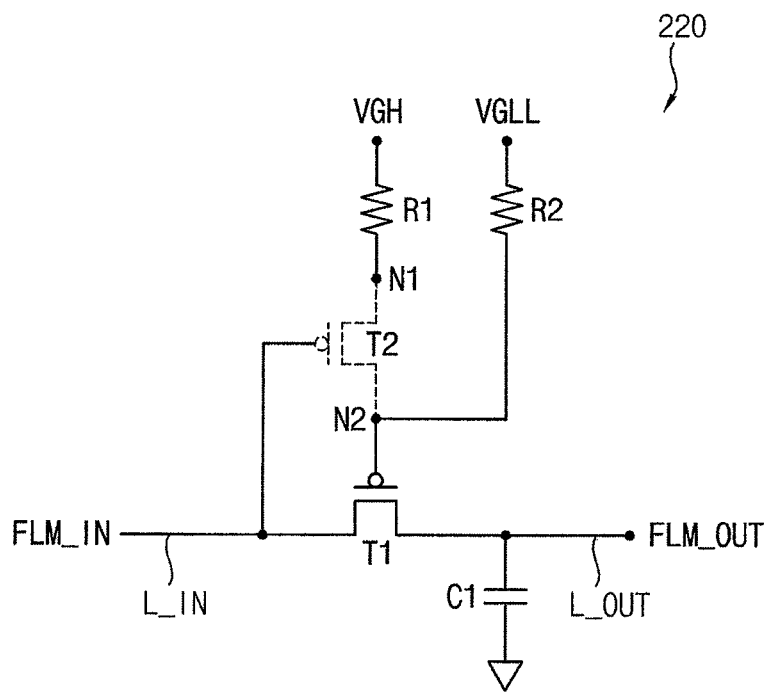
FIGS. 6A and 6B are circuit diagrams illustrating for describing an operation of the first block circuit of FIG. 5.
Figure 6B:
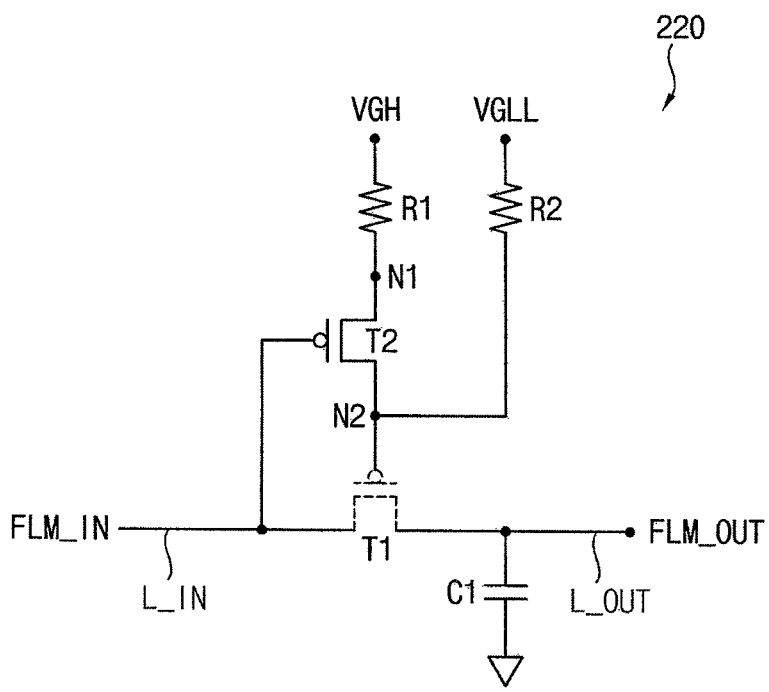
Figure 7:
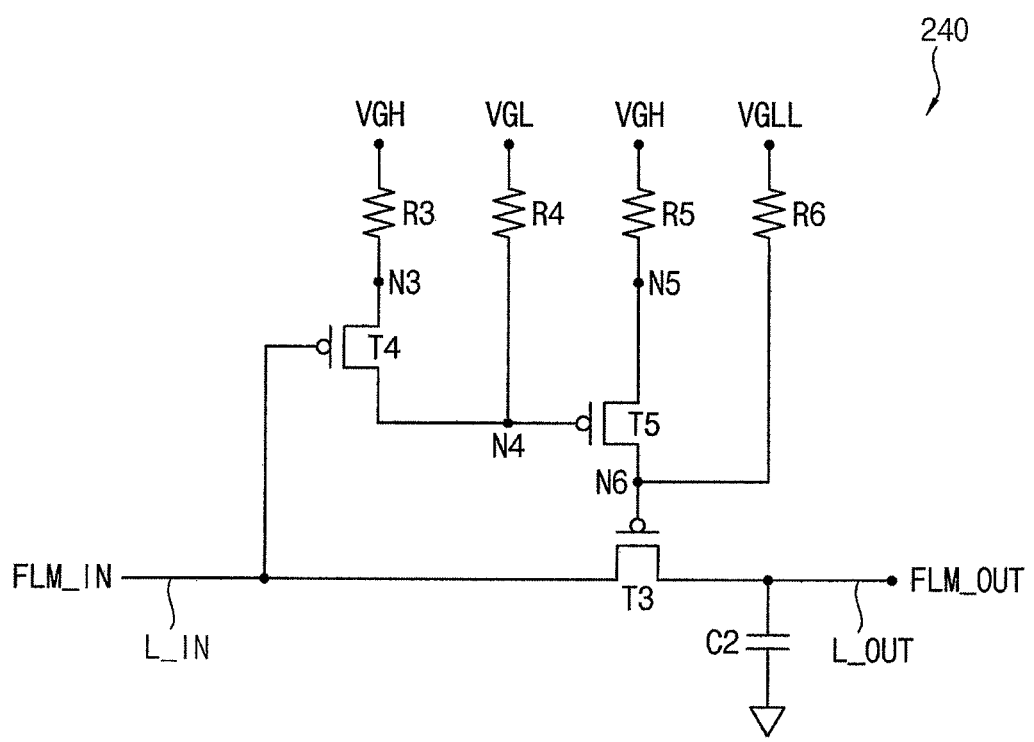
FIG. 7 is a circuit diagram illustrating a second block circuit included in the block circuit of FIG. 3.
Figure 8A:
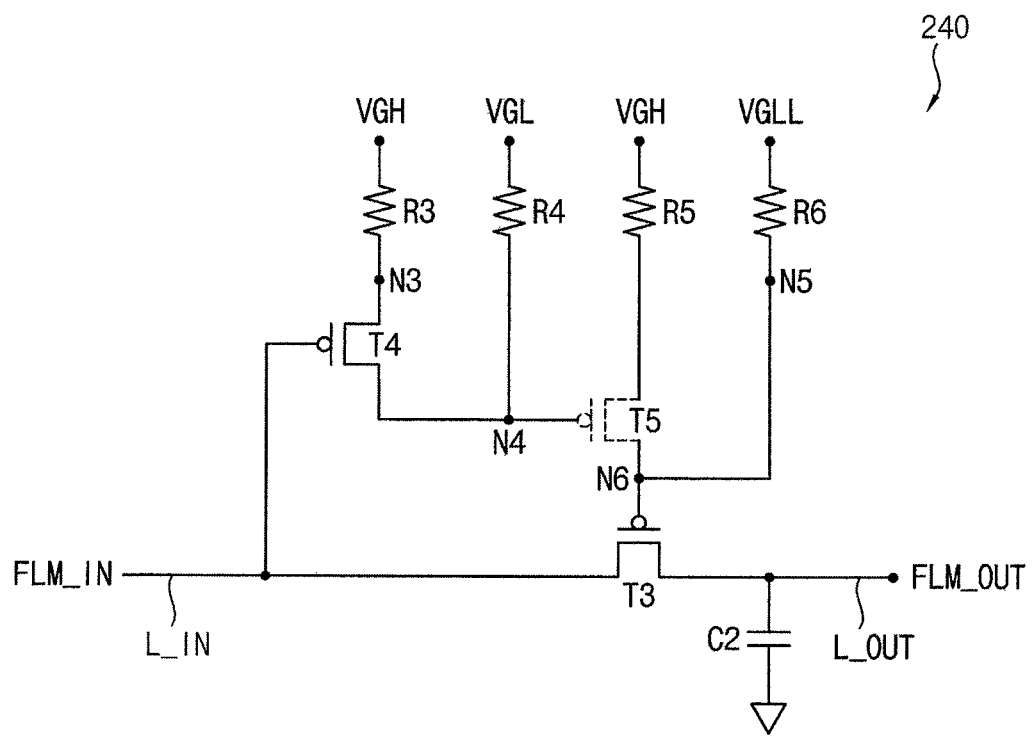
FIGS. 8A and 8B are circuit diagrams illustrating for describing an operation of the second block circuit of FIG. 7.
Figure 8B:
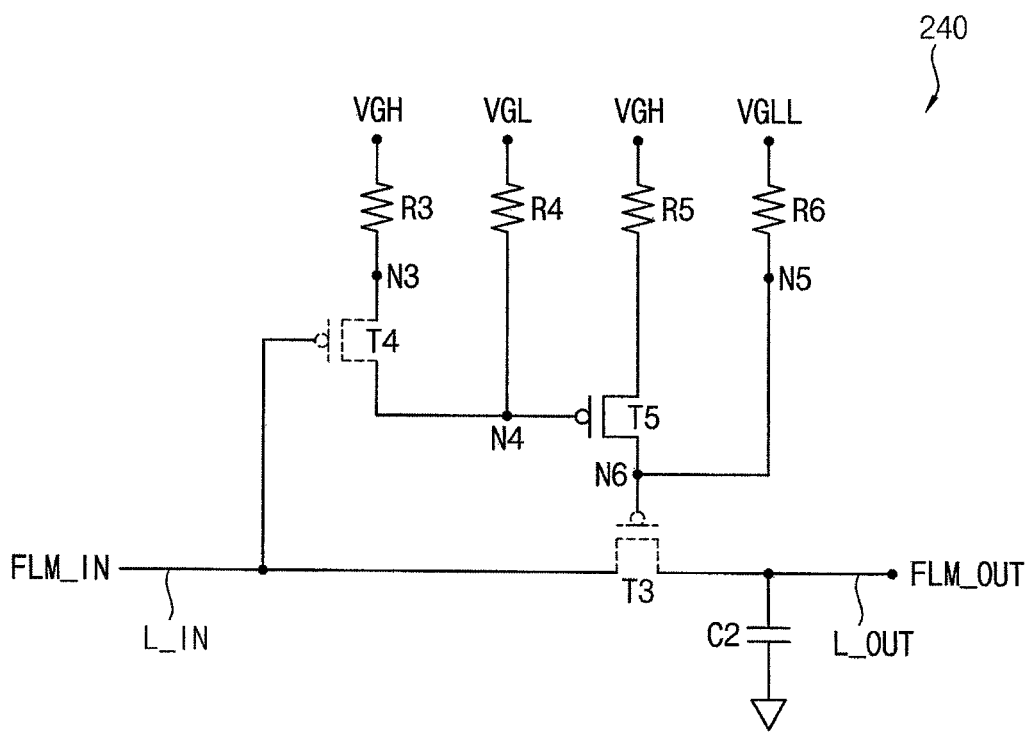

FIG. 5 is a circuit diagram illustrating a first block circuit included in the block circuit of FIG. 3. FIGS. 6A and 6B are circuit diagrams illustrating an operation of the first block circuit of FIG. 5. FIG. 7 is a circuit diagram illustrating a second block circuit included in the block circuit of FIG. 3. FIGS. 8A and 8B are circuit diagrams illustrating an operation of the second block circuit of FIG. 7.

Referring to FIG. 5, the first block circuit 220 may include a first resistor R1, a second resistor R2, a first transistor T1, a second transistor, and a first capacitor C1. Here, the first resistor R1 and the second resistor R2 may be formed in the printed circuit board or the flexible printed circuit board coupled to the display panel. The first transistor T1, the second transistor T2, and the first capacitor C1 may be formed in a non-display area of the display panel. The first resistor may be coupled between the first driving voltage providing line and a first node N1. The first driving voltage VGH provided through the first driving voltage providing line may be the same as the first driving voltage VGH provided to the stage of FIG. 2. For example, the first driving voltage VGH may have a high level voltage (e.g., 7V) higher than 0V. The second resistor may be coupled between the second driving voltage providing line and a second node N2. For example, the second driving voltage VGLL may have a low level (e.g., −12V) lower than 0V. The second driving voltage VGLL may be lower than the third driving voltage VGL (e.g., −9V) provided to the stage of FIG. 2.

A resistor value of the second resistor R2 may be more than 100 times greater than a resistor value of the first resistor R1. For example, when the resistor value of the first resistor R1 is 100Ω, the resistor value of the second resistor R2 may be 10 kΩ. The voltage of the second node N2 that turns on or turns off the first transistor T1 may be determined by controlling the resistor values of the first resistor R1 and the second resistor R2. The first transistor T1 may turn on or turn off in response to the voltage of the second node N2. The first transistor T1 may be coupled between an input line L_IN through which the input start signal FLM_IN is input and an output line L_OUT through which the output start signal FLM_OUT is output. The first transistor T1 may have a gate electrode, a first electrode, and a second electrode. The gate electrode of the first transistor T1 may be coupled to the second node N2, the first electrode of the first transistor may be coupled to the input line L_IN, and the second electrode may be coupled to the output line L_OUT. The input start signal FLM_IN provided through the input line L_IN may be output to the output line L_OUT through the first transistor T1 when the first transistor T1 turns on in response to the voltage of the second node N2. The second transistor T2 may turn on or turn off in response to the input start signal FLM_IN. The second transistor T2 may be coupled between the first node N1 and the second node N2. The second transistor T2 may include a gate electrode, a first electrode, and a second electrode. The gate electrode of the second transistor T2 may be coupled to the input line L_IN, the first electrode of the second transistor T2 may be coupled to the first node N1, and the second electrode of the second transistor T2 may be coupled to the second node N2. The first driving voltage VGH may be provided to the second node N2 through the first resistor R1 when the second transistor T2 turns on in response to the input start signal FLM_IN. The first capacitor C1 may be charged while the start signal FLM is output through the output line L_OUT and be discharged while the first transistor T1 turns off and the start signal FLM is blocked. Thus, the voltage output through the output line L_OUT may be maintained while the start signal FLM is blocked.

Referring to FIG. 6A, the second transistor T2 may turn off when the input start signal FLM_IN provided through the input line L_IN is higher than the first reference voltage. The second driving voltage VGLL may be provided to the second node N2 through the second resistor R2 when the second transistor T2 turns off. The input start signal FLM_IN provided through the input line L_IN may be output to the output line L_OUT when the first transistor T1 turns on in response to the voltage of the second node N2.

Referring to FIG. 6B, the second transistor T2 may turn on when the input start signal FLM_IN provided through the input line L_IN is lower than the first reference voltage. The first driving voltage VGH may be provided to the second node N2 through the first R1 when the second transistor turns on. The input start signal FLM_IN provided through the input line L_IN may not be output when the first transistor T1 turns off in response to the voltage of the second node N2. In this case, the voltage stored in the first capacitor may be provided to the output line L_OUT.

As described above, the first block circuit 220 of FIG. 5 may prevent or reduce instances of the input start signal FLM_IN outputting to the output line L_OUT when the input start signal FLM_IN having the voltage level lower than the first reference voltage (e.g., the predetermined first reference voltage). Further, the first block circuit 220 may be arranged on the clock signal providing line that provides the clock signal and block the clock signal lower than the first reference voltage although the first block circuit 220 that blocks the input start signal FLM_IN lower than the first reference voltage is described in FIGS. 5, 6A, and 6B.

Referring to FIG. 7, the second block circuit 240 may include a third resistor R3, a fourth resistor R4, a fifth resistor R5, a sixth resistor R6, a third transistor T3, a fourth transistor T4, a fifth transistor T5, and a second capacitor C2. Here, the third resistor R3, the fourth resistor R4, the fifth resistor R5, and the sixth resistor R6 may be formed on the printed circuit board or the flexible printed circuit board coupled to the display panel. The third transistor T3, the fourth transistor T4, and the fifth transistor T5 may be formed in the non-display area of the display panel. The third resistor R3 may be coupled between the first driving voltage providing ling and a third node N3. The fourth resistor R4 may be coupled between the third driving voltage providing line and a fourth node N4. The fifth resistor R5 may be coupled between the first driving voltage providing line and a fifth node N5. The sixth resistor R6 may be coupled between the second driving voltage providing line and a sixth node N6. For example, the first driving voltage VGH may be a high level voltage (e.g., 7V) higher than 0V. The second driving voltage VGLL is a low level voltage (e.g., −12V) lower than 0V. The voltage level of the second driving voltage VGLL may be lower than the voltage level of the third driving voltage VGL (e.g., −9V) provided to the stage of FIG. 2.

A resistor value of the third resistor R3 and a resistor value of the fifth resistor R5 may be the same. A resistor value of the fourth resistor and a resistor value of the sixth resistor R6 may be the same. The resistor values of the fourth resistor R4 and the sixth resistor R6 may be more than 100 times greater than the resistor values of the third resistor R3 and the fifth resistor R5. For example, when the resistor value of the third resistor R3 and the resistor value of the fifth resistor R5 are respectively 100Ω, the resistor value of the fourth resistor R4 and the sixth resistor R6 may be respectively 10 kΩ.

A voltage level of the fourth node N4 that turns on or turns off the fifth transistor T5 may be determined by controlling the resistor value of the third resistor R3 and the fourth resistor R4. A voltage level of the sixth node N6 that turns on or turns off the third transistor T3 may be determined by controlling the resistor value of the fifth resistor R5 and the sixth resistor R6. The third transistor T3 may turn on or turn off in response to the voltage of the sixth node N6. The third transistor T3 may turn on or turn off in response to the voltage applied to the sixth node N6. The third transistor T3 may be coupled between the input line L_IN through which the input start signal FLM_IN is input and the output line L_OUT through which the output start signal FLM_OUT is output. The third transistor T3 may include a gate electrode, a first electrode, and a second electrode. The gate electrode of the third transistor T3 may be coupled to the sixth node N6, the first electrode of the third transistor T3 may be coupled to the input line L_IN, and the second electrode of the third transistor T3 may be coupled to the output line L_OUT.

When the third transistor T3 turns on in response to the voltage of the sixth node N6, the input start signal FLM_IN provided through the input line L_IN may be output to the output line LOUT. The fourth transistor T4 may turn on or turn off in response to the input start signal FLM_IN. The fourth transistor T4 may be coupled between the third node N3 and the fourth node N4. The fourth transistor T4 may include a gate electrode, a first electrode, and a second electrode. The gate electrode of the fourth transistor T4 may be coupled to the input lint L_IN, the first electrode of the fourth transistor T4 may be coupled to the third node N3, and the second electrode of the fourth transistor T4 may be coupled to the fourth node N4. When the fourth transistor T4 turns on, the first driving voltage VGH may be provide to the fourth node N4 through the third resistor R3.

The fifth transistor T5 may turn on or turn off in response to the voltage of the fourth node N4. The fifth transistor T5 may be coupled between the fifth node N5 and the sixth node N6. The fifth transistor T5 may include a gate electrode, a first electrode, and a second electrode. The gate electrode of the fifth transistor T5 may be coupled to the fourth node N4, the first electrode of the fifth transistor T5 may be coupled to the fifth node N5, and the second electrode of the fifth transistor T5 may be coupled to the sixth node N6. When the fifth transistor T5 turns on the first driving voltage VGH may be provided to the sixth node N6 through the fifth resistor R5. The second capacitor C2 may be charged while the output start signal FLM_OUT is output through the output line L_OUT and may maintain the voltage output through the output line L_OUT while the input start signal FLM_OUT is blocked.

Referring to FIG. 8A, when the input start signal FLM_IN having a voltage level lower than the second reference voltage is provided through the input line L_IN, the fourth transistor T4 may turn on. The first driving voltage VGH may be provided to the fourth node N4 through the third resistor R3 when the fourth transistor T4 turns on. The fifth transistor T5 may turn off in response to the voltage of the fourth node N4. The second driving voltage VGLL may be provided to the sixth node N6 through the sixth resistor R6 when the fifth transistor T5 turns off. The input start signal FLM_IN provided through the input line L_IN may be output to the output line L_OUT as the output start signal FLM_OUT when the third transistor T3 turns on in response to the voltage of the sixth node N6. Here, the third transistor T3 may turn on when the input start signal FLM_IN having the voltage level the same as the third driving voltage VGL by providing the second driving voltage VGLL having the voltage level lower than the third driving voltage VGL to the sixth node N6.

Referring to FIG. 8B, when the input start signal FLM_IN having the voltage level higher than the second reference voltage is provided through the input line L_IN, the fourth transistor T4 may gradually turn off. That is, the fourth transistor T4 may turn on and may gradually turn off when the input start signal FLM_IN having the voltage level of the third driving voltage VGL gradually increases and to be higher than the second reference voltage. Thus, the voltage of the fourth node N4 may be gradually decreased. That is, the voltage of the fourth node N4 may gradually decrease as the input start signal FLM_IN gradually increases. When the voltage of the fourth node N4 decreases to a turn-on level of the fifth transistor T5, the fifth transistor T5 may turn on. When the fifth transistor T5 turns on, the first driving voltage VGH may be provided to the sixth node N6 through the fifth resistor R5. When the third transistor T3 turns off in response to the voltage of the sixth node N6, the input start signal FLM_IN provided through the input line L_IN may not be output. In this case, the voltage charged in the second capacitor C3 may be provided to the output line L_OUT as the output start signal FLM_OUT.

As described above, the second block circuit 240 of FIG. 7 may block the input start signal FLM_IN when the input start signal FLM_IN having the voltage level higher than the predetermined second reference voltage. Further, the second block circuit 240 may be arranged on the clock signal providing line that provides the clock signal and block the clock signal having a voltage level higher than the second reference voltage although the second block circuit 240 that blocks the input start signal FLM_IN having the voltage level higher than the second reference voltage is described in FIGS. 7, 8A, and 8B.

As described above, the first block circuit 220 may block the input start signal FLM_IN lower than the first reference voltage and output the charged voltage (e.g., the first driving voltage VGH) as the output start signal FLM_OUT, so that the first block circuit 220 may prevent or reduce instances of the input start signal FLM_IN lower than the first reference voltage being provided to the stage in the high period PH. Further, the second block circuit 240 may block the input start signal FLM_IN higher than the second reference voltage and output the charged voltage (e.g., the third driving voltage VGL) as the output start signal FLM_OUT, so that the second block circuit 240 may prevent or reduce instances of the input signal FLM_IN higher than the second reference voltage being provided to the stage in the low period PL.

Figure 9:
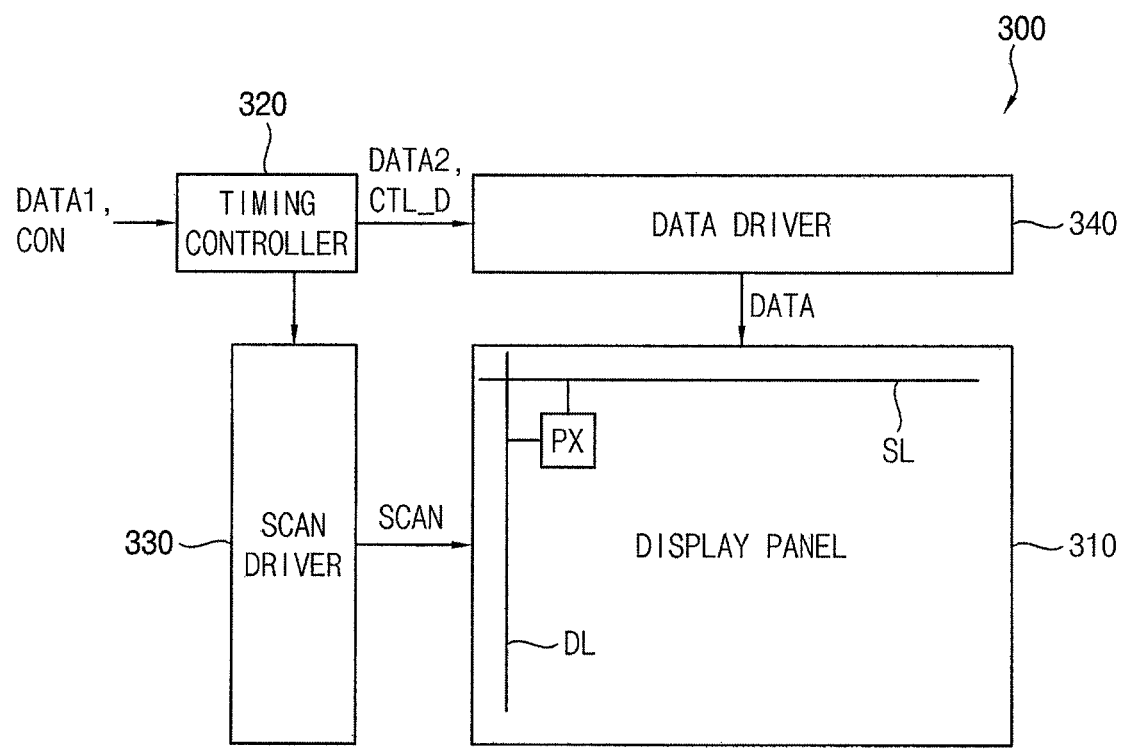
FIG. 9 is a block diagram illustrating a display device according to some example embodiments.
Figure 10:
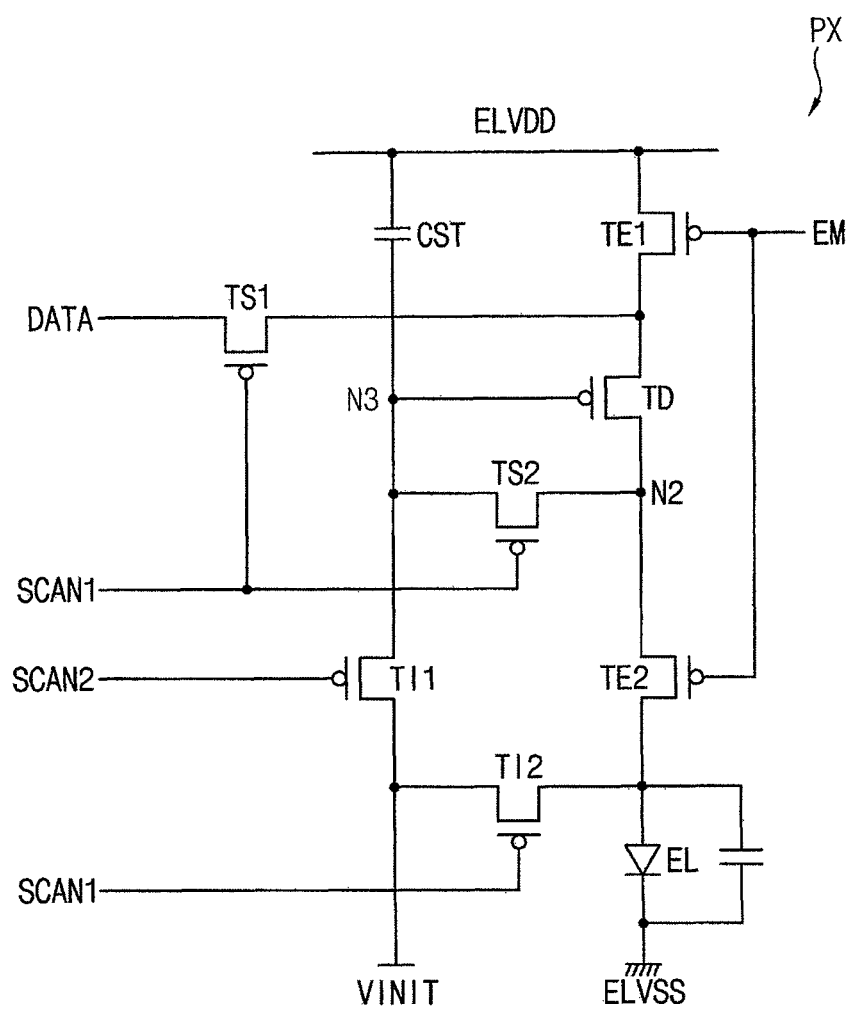
FIG. 10 is a circuit diagram illustrating an example embodiment of a pixel included in the display device of FIG. 9.

FIG. 9 is a block diagram illustrating a display device according to example embodiments. FIG. 10 is a circuit diagram illustrating an example embodiment of a pixel included in the display device of FIG. 9.

Referring to FIG. 9, a display device 300 may include a display panel 310, a timing controller 320, a scan driver 330, and a data driver 340. The scan driver 330 of FIG. 9 may correspond to the scan driver 100 of FIG. 1.

The display panel may include a plurality of pixels PX. A plurality of data lines DL and a plurality of scan lines may be formed on the display panel 310. The plurality of pixels may be formed in intersection regions of the data lines DL and the scan lines SL.

Referring to FIG. 10, the pixel PX may include a driving transistor TD, a first switching transistor TS1, a second switching transistor TS2, a first initialization transistor TI1, a second initialization transistor TI2, a first emission control transistor rE1, a second emission control transistor TE2, a storage capacitor, and an organic light emitting diode EL. A frame may include an initialization period, a data writing period, and an emission period. The first initialization transistor TI1 may turn on in response to a second scan signal SCAN2 and the second initialization transistor TI2 may turn on in response to a first scan signal SCAN1 during the initialization period. When the first initialization transistor TI turns on, a gate electrode of the driving transistor TD may be initialized as an initialization voltage Vinit. The first switching transistor TS1 and the second switching transistor TS2 may turn on in response to the first scan signal SCAN1 during the data writing period. When the first switching transistor TS1 and the second switching transistor TS2 turn on, a threshold voltage of the driving transistor TD may be compensated by a diode connection of the driving transistor TD and the data voltage DATA (e.g., the data signal) provided through the data line DL may be stored in the storage capacitor Cst. The first emission control transistor TE1 and the second emission control transistor TE2 may turn on in response to the emission control signal EM during the emission period. When the first emission control transistor TE1 and the second emission control transistor TE2 turn on, a driving current flowing through the driving transistor TD may be provided to the organic light emitting diode EL and the organic light emitting diode EL may emit light. The first scan signal SCAN1 and the second scan signal SCAN2 provided during the initialization period and the data writing period may be provided from the scan driver 330. For example, the first scan signal SCAN1 may be a scan signal output from an Nth stage of the scan driver 330 and the second scan signal SCAN2 may be a scan signal output from an (N−1)th stage of the scan driver 330.

The timing controller may convert a first image data DATA1 provided from an external device to a second image data DATA2 and generate a scan control signal CTL_S and a data control signal CTL_D that control a driving timing of the second image data DATA2. The timing controller 320 may convert the first image data DATA1 provided from the external device to the second image data DATA2 by applying an algorithm (e.g., a dynamic capacitance compensation (DCC)) for improving display quality. When the timing controller 320 does not include the algorithm for improving display quality, the first image data DATA1 may be output as the second image data DATA2. The timing controller 320 may receive a control signal CON from the external device. The timing controller 320 may generate the scan control signal CTL_S that includes a start signal and at least one clock signal and provide the scan control signal CTL_S to the scan driver 330. The timing controller 320 may generate a data control signal CTL_D that includes a start signal and at least one clock signal and provide the data control signal CTL_D to the data driver 340.

The scan driver 330 may generate the scan signal SCAN based on the scan control signal CTL_S and provide the scan signal SCAN to the pixels PX through the scan lines SL. The scan driver 330 may include a block circuit and a plurality of stages. Each of the stages may receive the scan control signal CTL_S. For example, the scan control signal CTL_S may include the start signal, a first clock signal, and a second clock signal. A first stage coupled to a first scan line may output the scan signal based on the start signal, the first clock signal, and the second clock signal. For example, the first scan line may be coupled to the pixels formed in a first column of the display panel 310. An Nth stage may coupled to a Nth scan line may output the scan signal based on a carry signal provided from an (N−1)th stage, the first clock signal, and the second clock signal. For example, the Nth scan line may be coupled to the pixels formed in the Nth column of the display panel 310. As described above, the stages of the scan driver 330 may be dependently coupled and sequentially output the scan signal SCAN to the scan lines form on the display panel 310. The block circuit may be coupled to a providing line that provides the scan control signal CLT_S.

For example, the block circuit may be respectively coupled to a start signal providing line that provides the start signal, a first clock signal providing line that provides the first clock signal, and a second clock signal providing line that provides the second clock signal. The block circuit may block the scan control signal CTL_S having a voltage level lower than a first reference voltage and higher than a second reference voltage. The block circuit may include a first block circuit and a second block circuit. The first block circuit and a second block circuit may be coupled in parallel. When the scan control signal CTL_S having a voltage level higher than the first reference voltage is provided, the first block circuit may output the scan control signal CTL_S. When the scan control signal CTL_S having a voltage level lower than the first reference voltage is provided, the first block circuit may block the scan control signal CTL_S. When the scan control signal CTLS_S having a voltage level lower than the second reference voltage is provided, the second block circuit may output the scan control signal CTL_S. When the scan control signal CTL_S having a voltage level higher than the second reference voltage is provided, the second block circuit may block the scan control signal CTL_S. The scan driver 330 may prevent or reduce instances of an abnormal scan signal outputting to the scan line by blocking the scan control signal CTL_S having a voltage level lower than the first reference voltage and higher than the second reference voltage.

The data driver 340 may generate the data signal DATA corresponding to the second image data DATA2 based on the data control signal CTL_D and provide the data signal DATA to the pixels PX thorough the data lines DL.

As described above, the display device 300 of FIG. 9 may include the scan driver 330 that includes the block circuit that blocks the scan control signal CTL_S having the voltage level lower than the first reference voltage and higher than the second reference voltage, so that the scan signal SCAN generated by the abnormal scan control signal CTL_S may not be output. Thus, the display defect may not be occurred.

Figure 11:
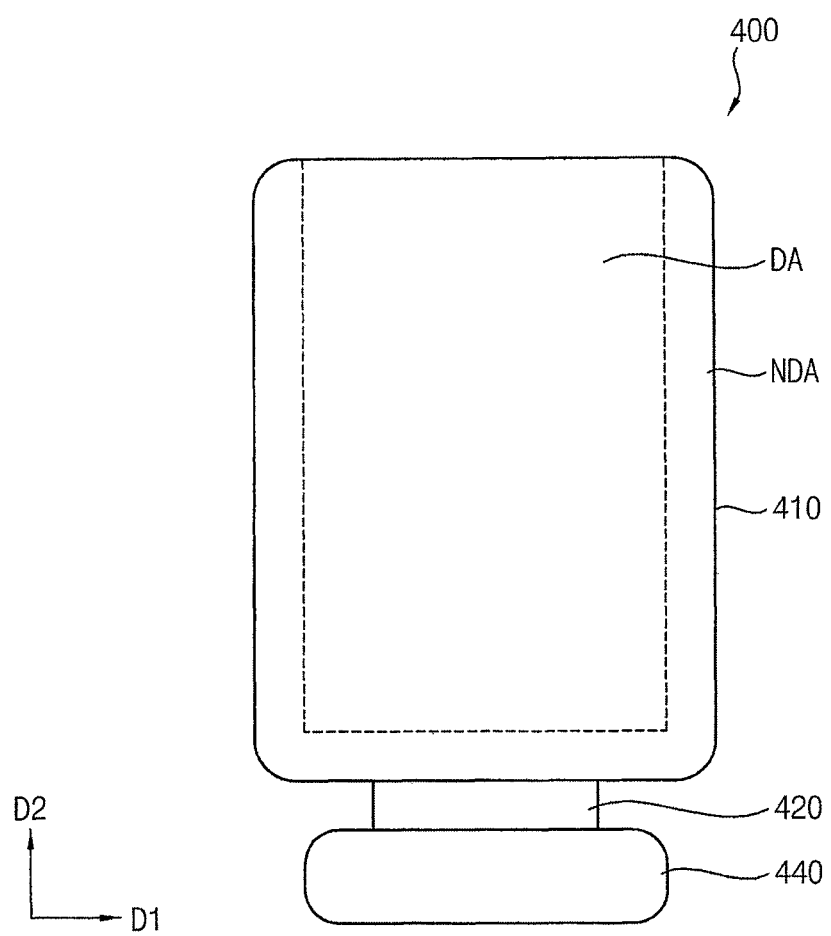
FIG. 11 is a diagram illustrating the display device of FIG. 9.

FIG. 11 is a diagram illustrating the display device of FIG. 9.

Referring to FIG. 11, a display device 400 may include a flexible printed circuit board (FPCB) 420, and a printed circuit board (PCB) 440.

The display panel 410 may include a display area DA and a non-display area NDA. A plurality of scan lines and a plurality of data lines may be formed in the display area DA and the non-display area NDA. For example, the scan lines may extend in a first direction D1 and be arranged in a second direction D2 perpendicular to the first direction D1. The data lines may extend in the second direction D2 and be arranged in the first direction D1. The first direction D1 may be parallel with a short side of the display panel 410, and the second direction D2 may be parallel with a long side of the display panel 410. The pixels may be formed in intersection regions of the scan data lines and the data lines in the display area DA. The scan driver may be formed in the non-display area NDA. Here, the scan driver may correspond to the scan driver 100 of FIG. 1. For example, stages of the scan driver may be arranged in the second direction D2 and be coupled to the scan lines. A block circuit of the scan driver may be formed in the non-display area NDA and the flexible printed circuit board 420 or the printed circuit board 440. The transistors and the capacitors of the block circuit may be formed in the non-display area NDA and the resistors may be formed in the flexible printed circuit board 420 or the printed circuit board 440. The data driver may be formed in the non-display area NDA of the display panel 410. Here, the data driver may be implemented as a driving chip and may be mounted on the non-display area NDA of the display panel 410 in a chip on glass (COG) method.

The flexible printed circuit board 420 may coupled the display panel 410 and the printed circuit board 440. The resistors of the block circuit may be mounted on the flexible printed circuit board 420. Alternatively, the data driver may be mounted on the flexible printed circuit board 420 in a chip on film (COF) method.

The timing controller, a power controller, etc. implemented as a chip may be mounted on the printed circuit board 440. The printed circuit board 440 may include a connection part coupled to an external device such as a graphic processor. Further, the resistors of the block circuit may be mounted on the printed circuit board 440.

Figure 12:
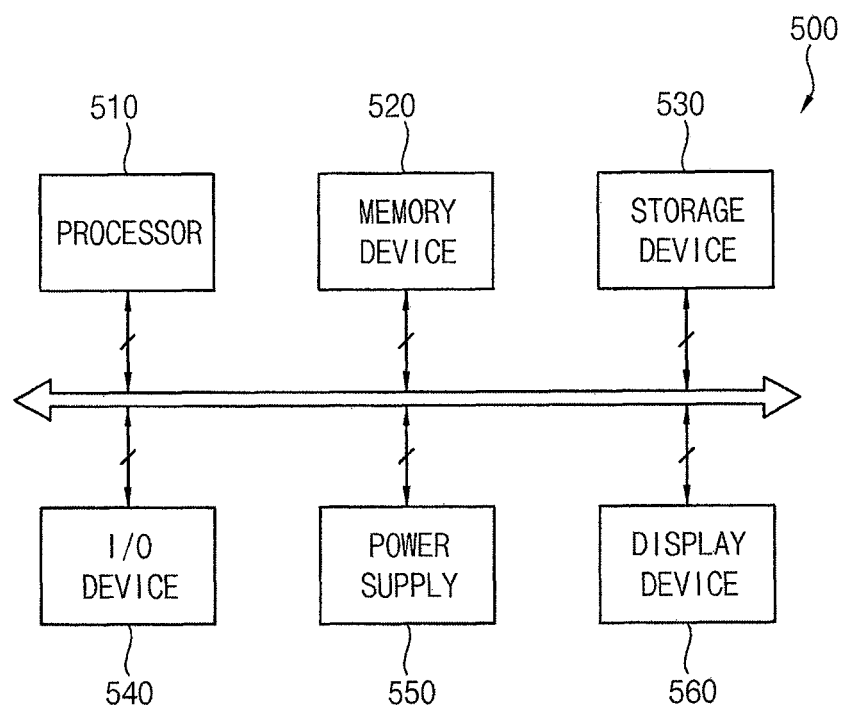
FIG. 12 is a block diagram illustrating an electronic device that includes the display device of FIG. 9.
Figure 13:
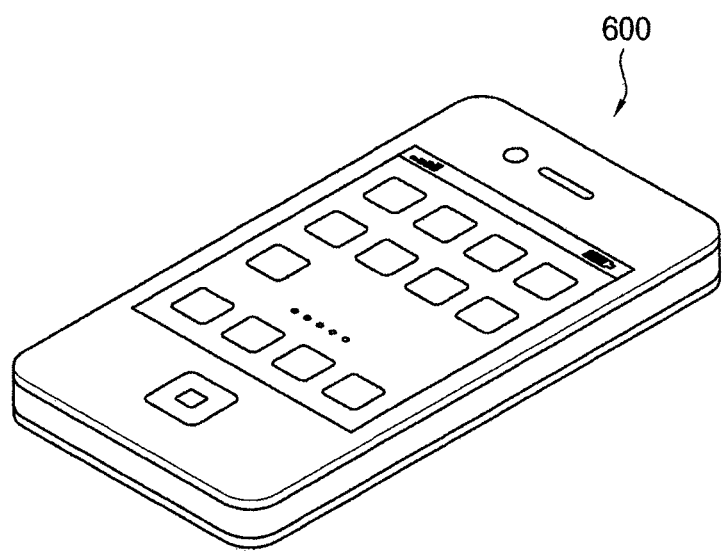
FIG. 13 is a diagram illustrating an example embodiment in which the electronic device of FIG. 12 is implemented as a smart phone.

FIG. 12 is a block diagram illustrating an electronic device that includes the display device of FIG. 9. FIG. 13 is a diagram illustrating an example embodiment in which the electronic device of FIG. 12 is implemented as a smart phone.

Referring to FIGS. 12 and 13, an electronic device 500 may include a processor 510, a memory device 520, a storage device 530, an input/output (I/O) device 540, a power device 550, and a display device 560. Here, the display device 560 may correspond to the display device 300 of FIG. 9. In addition, the electronic device 500 may further include a plurality of ports for communicating a video card, a sound card, a memory card, a universal serial bus (USB) device, other electronic device, etc. Although it is illustrated in FIG. 13 that the electronic device 500 is implemented as a smart phone 600, a kind of the electronic device 500 is not limited thereto.

The processor 510 may perform various computing functions. The processor 510 may be a microprocessor, a central processing unit (CPU), etc. The processor 510 may be coupled to other components via an address bus, a control bus, a data bus, etc. Further, the processor 510 may be coupled to an extended bus such as surrounded component interconnect (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 530 may be a solid stage drive (SSD) device, a hard disk drive (HDD) device, a CD-ROM device, etc.

The I/O device 540 may be an input device such as a keyboard, a keypad, a touchpad, a touch-screen, a mouse, etc, and an output device such as a printer, a speaker, etc. In some example embodiments, the display device 560 may be included in the I/O device 540. The power device 550 may provide a power for operations of the electronic device 500. The display device 560 may communicate with other components via the buses or other communication links.

As described above, the display device 560 may include a display panel, a timing controller, a scan driver, and a data driver. The display panel may include a plurality of pixels, a plurality of data lines, and a plurality of scan lines. The timing controller may convert a first image data provided from an external device to a second image data and generate a scan control signal and a data control signal that control a driving timing of the second image data. The scan driver may output scan signals in response to the scan control signal. For example, the scan control signal may include a start signal, a first clock signal, and a second clock signal.

The scan driver may include block circuits that block an abnormal scan control signal and a plurality of stages that generate the scan signals based on the scan control signal. The block circuit may be coupled to a providing line that provides the scan control signal. For example, the block circuit may be respectively coupled to a start signal providing line through which the start signal is provided, a first clock signal providing line through which the first clock signal is provided, and a second clock signal providing line through which the second clock signal is provided. The block circuit may block the scan control signal having a voltage level lower than a first reference voltage and a second reference voltage. Here, the second reference voltage may be lower than the first reference voltage.

Each of the stages may receive the scan control signal and output the scan signal based on the scan control signal. When the abnormal scan control signal is provided, a switching transistor included in the stage of the scan driver may turn on in abnormal timing, so that the scan driver may output the abnormal scan signal. The display device 560 included in the electronic device 500 according to example embodiments may prevent that the abnormal scan signal is output by blocking the scan control signal having a voltage level lower than the first reference voltage and higher than second reference voltage (e.g., having abnormal voltage level). The data driver may generate a data signal corresponding to the second image data based on the data control signal and provide the data signal to the pixels through the data lines.

As described above, the electronic device 500 of FIG. 12 may include the display device 560 that includes the block circuit that blocks the abnormal scan control signal. Thus, instances of the display defect occurring due to the abnormal scan signal may be prevented or reduced.

The present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and characteristics of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and their equivalents.

What is claimed is:

1. A scan driver comprising:
 a blocking circuit configured to receive a scan control signal and to block the scan control signal lower than a predetermined first reference voltage and higher than a predetermined second reference voltage, wherein the second reference voltage is higher than the first reference voltage; and
 a plurality of stages configured to output scan signals in response to the scan control signal,
 wherein the blocking circuit includes:
 a first block circuit configured to block the scan control signal lower than the first reference voltage; and
 a second block circuit configured to block the scan control signal higher than the second reference voltage.

2. The scan driver of claim 1, wherein the first block circuit and the second block circuit are coupled in parallel.

3. The scan driver of claim 2, wherein the first block circuit includes:
 a first resistor coupled between a first driving voltage providing line and a first node;
 a second resistor coupled between a second driving voltage providing line and a second node;
 a first transistor coupled between an input line through which the scan control signal is input and an output line through which the scan control signal is output, the first transistor being configured to turn on or turn off in response to a voltage of the second node;
 a second transistor coupled between the first node and the second node, wherein the second transistor is configured to turn on or turn off in response to the scan control signal; and
 a first capacitor coupled to the output line.

4. The scan driver of claim 3, wherein a resistor value of the second resistor is more than 100 times greater than a resistor value of the first resistor.

5. The scan driver of claim 3, wherein a voltage level of a second driving voltage provided through the second driving voltage providing line is lower than a voltage level of a first driving voltage provided through the first driving voltage providing line.

6. The scan driver of claim 3, wherein the first transistor is configured to turn off when the scan control signal having a voltage level lower than the first reference voltage is provided and the scan control signal is not output, and
 wherein the first transistor is configured to turn on when the scan control signal having a voltage level higher than the first reference voltage is provided and the scan control signal is output.

7. The scan driver of claim 2, wherein the second block circuit includes:
 a third resistor coupled between a first driving voltage providing line and a third node;
 a fourth resistor coupled between a third driving voltage providing line and a fourth node;
 a fifth resistor coupled between the first driving voltage providing line and a fifth node;
 a sixth resistor coupled between a second driving voltage providing line and a sixth node;
 a third transistor coupled between an input line through which the scan control signal is input and an output line through which the scan control signal is output, the third transistor being configured to turn on or turn off in response to a voltage of the sixth node;
 a fourth transistor coupled between the third node and the fourth node, the fourth transistor being configured to turn on or turn off in response to the scan control signal;
 a fifth transistor coupled between the fifth node and the sixth node, the fifth transistor being configured to turn on or turn off in response to a voltage of the fourth node; and
 a second capacitor coupled to the output line.

8. The scan driver of claim 7, wherein a resistor value of the third resistor and a resistor value of the fifth resistor are the same,
 wherein a resistor value of the fourth resistor and a resistor value of the sixth resistor are the same, and
 wherein the resistor values of the fourth resistor and the sixth resistor are more than 100 times greater than the resistor values of the third resistor and the fifth resistor.

9. The scan driver of claim 7, wherein a voltage level of a first driving voltage provided through the first driving voltage providing line is higher than a voltage level of a second driving voltage provided through the second driving voltage providing line and a voltage level of a third driving voltage provided through the third driving voltage providing line.

10. The scan driver of claim 7, wherein the third transistor is configured to turn off and the scan control signal is not output when the scan control signal having a voltage level higher than the second reference voltage is provided, and wherein the third transistor is configured to turn on and the scan control signal is output when the scan control signal having a voltage level lower than the second reference voltage is provided.

11. The scan driver of claim 1, wherein the scan control signal includes a start signal and at least one clock signal.

12. The scan driver of claim 11, wherein the block circuit is respectively coupled to a start signal providing line through which the start signal is provided and a clock signal providing line through which the clock signal is provided.

13. A display device comprising:
a display panel including a plurality of pixels, a plurality of data lines coupled to the pixels, and a plurality of scan lines coupled to the pixels;
a timing controller configured to convert a first image data provided from an external device to a second image data and to generate a scan control signal and a data control signal that control a driving timing of the second image data;
a scan driver configured to generate a scan signal based on the scan control signal and to provide the scan signal to the pixels through the scan lines; and
a data driver configured to generate a data signal corresponding to the second image data based on the data control signal and to provide the data signal to the pixels through the data lines,
wherein the scan driver includes:
a block circuit configured to block the scan control signal having a voltage level lower than a predetermined first reference voltage and lower than a predetermined second reference voltage that is lower than the first reference voltage; and
a plurality of stages configured to output a scan signal in response to the scan control signal,
wherein the block circuit includes:
a first block circuit configured to block the scan control signal lower than the first reference voltage; and
a second block circuit configured to block the scan control signal higher than the second reference voltage.

14. The display device of claim 13, wherein the first block circuit and the second block circuit are coupled in parallel.

15. The display device of claim 14, wherein the first block circuit includes:
a first resistor coupled between a first driving voltage providing line and a first node;
a second resistor coupled between a second driving voltage providing line and a second node;
a first transistor coupled between an input line through which the scan control signal is input and an output line through which the scan control signal is output, the first transistor being configured to turn on or turn off in response to a voltage of the second node;
a second transistor coupled between the first node and the second node, the second transistor being configured to turn on or turn off in response to the scan control signal; and
a first capacitor coupled to the output line.

16. The display device of claim 15, wherein the first transistor is configured to turn off and the scan control signal is not output when the scan control signal having a voltage level lower than the first reference voltage is provided, and wherein the first transistor is configured to turn on and the scan control signal is output when the scan control signal having a voltage level higher than the first reference voltage is provided.

17. The display device of claim 15, wherein the first resistor and the second resistor are mounted on a printed circuit board (PCB) or a flexible printed circuit board (FPCB).

18. The display device of claim 14, wherein the second block circuit includes:
a third resistor coupled between a first driving voltage providing line and a third node;
a fourth resistor coupled between a third driving voltage providing line and a fourth node;
a fifth resistor coupled between the first driving voltage providing line and a fifth node;
a sixth resistor coupled between a second driving voltage providing line and a sixth node;
a third transistor coupled between an input line through which the scan control signal is input and an output line through which the scan control signal is output, the third transistor being configured to turn on or turn off in response to a voltage of the sixth node;
a fourth transistor coupled between the third node and the fourth node, the fourth transistor being configured to turn on or turn off in response to the scan control signal;
a fifth transistor coupled between the fifth node and the sixth node, the fifth transistor being configured to turn on or turn off in response to a voltage of the fourth node; and
a second capacitor coupled to the output line.

19. The display device of claim 18, wherein the third transistor is configured to turn off and the scan control signal is not output when the scan control signal having a voltage level higher than the second reference voltage is provided, and wherein the third transistor is configured to turn on and the scan control signal is output when the scan control signal having a voltage level lower than the second reference voltage is provided.

20. The display device of claim 18, wherein the third resistor, the fourth resistor, the fifth resistor, and the sixth resistor are mounted on a printed circuit board (PCB) or a flexible printed circuit board (FPCB).

* * * * *